(12) United States Patent
Vettori et al.

(10) Patent No.: US 11,029,336 B2
(45) Date of Patent: Jun. 8, 2021

(54) PROBE CARD FOR HIGH-FREQUENCY APPLICATIONS

(71) Applicant: TECHNOPROBE S.P.A., Cernusco Lombardone (IT)

(72) Inventors: Riccardo Vettori, Lecco (IT); Stefano Felici, San Jose, CA (US)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 8 days.

(21) Appl. No.: 16/537,770

(22) Filed: Aug. 12, 2019

(65) Prior Publication Data

US 2019/0361051 A1 Nov. 28, 2019

Related U.S. Application Data

(63) Continuation-in-part of application No. PCT/EP2018/053593, filed on Feb. 13, 2018.

(30) Foreign Application Priority Data

Feb. 15, 2017 (IT) .................. 102017000017061

(51) Int. Cl.
*G01R 1/073* (2006.01)
*G01R 3/00* (2006.01)

(52) U.S. Cl.
CPC ........... *G01R 1/07314* (2013.01); *G01R 3/00* (2013.01)

(58) Field of Classification Search
CPC .............................. G01R 1/07314; G01R 3/00
See application file for complete search history.

(56) References Cited

U.S. PATENT DOCUMENTS 5,252,916 A * 10/1993 Swart ................. G01R 1/07307
324/754.15
5,389,885 A * 2/1995 Swart ................. G01R 1/07307
324/754.14

(Continued)

FOREIGN PATENT DOCUMENTS

JP 3596500 12/2004

*Primary Examiner* — Paresh Patel
(74) *Attorney, Agent, or Firm* — Allen, Dyer, Doppelt + Gilchrist, P.A.

(57) ABSTRACT

A probe card for a testing apparatus of electronic devices comprises a testing head, which houses a plurality of contact elements extending along a longitudinal axis (H-H) between a first end portion and a second end portion, a support plate, onto which the first end portion is adapted to abut, and a flexible membrane which comprises a first face and a second and opposite face. Conveniently, the first portion of the flexible membrane is arranged on at least one support and comprises a plurality of strips extending between a proximal end and a distal end, the probe card further including a plurality of micro contact probes comprising a body extending along the longitudinal axis (H-H) between a first end portion and a second end portion, the second end portion of each contact element abutting onto the first face of the flexible membrane at the distal end of a respective strip, and the first end portion of each micro contact probe abutting onto the second face of the flexible membrane at a respective contact element, the flexible membrane being electrically connected to the support plate through a second portion thereof, the second end portion of the micro contact probes being apt to contact the contact pads of a device to be tested, wherein the at least one support is provided with a plurality of guide holes for the housing of the plurality of micro contact probes.

25 Claims, 12 Drawing Sheets

(56) References Cited

U.S. PATENT DOCUMENTS

| 5,633,598 | A | * | 5/1997 | Van Loan | ............ | G01R 1/07328 |
|---|---|---|---|---|---|---|
| | | | | | | 324/754.08 |
| 2004/0036493 | A1 | | 2/2004 | Miller | | |
| 2004/0046579 | A1 | | 3/2004 | Chraft et al. | | |
| 2004/0070413 | A1 | | 4/2004 | Kasukabe et al. | | |
| 2008/0061808 | A1 | | 3/2008 | Mok et al. | | |

* cited by examiner

PROBE CARD FOR HIGH-FREQUENCY APPLICATIONS

BACKGROUND

Technical Field

The disclosure relates to a probe card for testing electronic devices that are integrated on a semi-conductor wafer, and the following description is made with reference to this application field with the only purpose of simplifying the exposition.

Description of the Related Art

As it is well known, a probe card is a device adapted to electrically connect a plurality of contact pads of a microstructure, in particular an electronic device that is integrated on a semiconductor wafer, with corresponding channels of a testing apparatus that performs the functionality testing thereof, in particular electric, or generically the test.

The test, which is performed on integrated devices, is particularly useful for detecting and isolating defective circuits as early as in the production phase. Normally, probe cards are therefore used for the electric test of devices that are integrated on wafers before cutting and assembling them inside a chip containment package.

A probe card comprises a testing head, which includes in turn a plurality of movable contact probes retained by at least one pair of supports or guides that are substantially plate-shaped and parallel to each other. These plate-shaped supports are provided with suitable holes and are arranged at a certain distance from each other in order to leave a free space or air gap for the movement and possible deformation of the contact probes, which are usually made of wires of special alloys with good electric and mechanical properties.

FIG. 1 schematically illustrates a known probe card 15 including a testing head 1 comprising in turn at least one plate-shaped support or upper guide 2, usually indicated as "upper die", and a plate-shaped support or lower guide 3, usually indicated as "lower die", having respective guide holes 4 and 5 within which a plurality of contact probes 6 slides.

Each contact probe 6 ends at an end with a contact tip 7 intended to abut onto a contact pad 8 of a device under test that is integrated on a wafer 9, so as to realize the mechanical and electric contact between the device under test and a testing apparatus (not shown), said probe card being a terminal element of this testing apparatus.

As indicated in FIG. 1, the upper guide 2 and the lower guide 3 are suitably spaced by an air gap 10 that allows the deformation of the contact probes 6.

The proper connection between the contact probes 6 and the contact pads 8 of the device under test is ensured by the pressure of the testing head 1 on the device itself, the contact probes 6, mobile within the guide holes formed in the guides, undergoing, during said pressing contact, a bending inside the air gap 10 and a sliding inside said guide holes. Testing heads of this type are commonly called "vertical probe heads".

In some cases, the contact probes are fixedly fastened to the head itself at the upper plate-shaped support: such testing heads are referred to as "blocked probe testing heads".

More frequently, testing heads are used with not fixedly fastened blocked probes, but interfaced to a so-called board, possibly through a micro-contact board: such testing heads are referred to as unblocked testing heads. The micro-contact board is usually called "space transformer" since, besides contacting the probes, it also allows spatially redistributing the contact pads realized thereon with respect to the contact pads on the device under test, in particular relaxing the distance constraints between the centers of the pads themselves.

In this case, still referring to FIG. 1, each contact probe 6 has a further end area or region ending with a so-called contact head 11 towards a contact pad 12 of a plurality of contact pads of a space transformer 13 of the probe card 15 comprising the testing head 1. The proper electric connection between the contact probes 6 and the space transformer 13 is ensured by the abutment of the contact heads 11 of the contact probes 6 onto the contact pads 12 of said space transformer 13 analogously to the contact between the contact tips 7 with the contact pads 8 of the device under test that is integrated on the wafer 9.

Furthermore, the probe card 15 comprises a support plate 14, generally a printed circuit board (PCB), connected to the space transformer 13, by means of which the probe card 15 interfaces with the testing apparatus.

The correct operation of a probe card is basically linked to two parameters: the vertical movement, or overtravel, of the contact probes and the horizontal movement, or scrub, of the contact tips of such contact probes on the contact pads.

All these features should be evaluated and calibrated in the manufacturing step of a probe card, since the good electric connection between probes and device under test should always be ensured.

It is also important to ensure that the pressing contact of the contact tips of the probes onto the contact pads of the device under test be not so high as to cause the breakage of the probe or the pad itself.

This problem is strongly felt in the case of the so-called short probes, namely probes with limited body length, in particular with dimensions less than 5000 μm. Probes of this type are for instance used for high-frequency applications, the reduced length of the probes limiting the connected self-inductance phenomenon. In particular, the term "probes for high-frequency applications" indicates probes that are capable of carrying signals with frequencies higher than 1 GHz.

There is the need of producing probe cards capable of carrying signals at ever higher frequencies up to the radiofrequencies, with a consequent drastic reduction in length of the contact probes, so as to enable these signals to be carried without adding noise thereto, for example due to the above-mentioned self-inductance phenomenon.

However, in this case, the reduced length of the body of the probes dramatically increases the rigidity of the probe itself, which leads to an increase in the force applied by the respective contact tip onto the contact pads of a device under test, which can lead to the breakage of those pads, with irreparable damage to the device under test, which is a situation that has to be avoided. Even more dangerously, the increase in the rigidity of the contact probe due to the reduction in the length of its body also increases the risk of breakage of the probes themselves.

U.S. Patent Publications 2004/0046579 A1 and 2004/0036493 A1 disclose a probe card equipped with a flexible membrane adapted to carry high frequency signals.

SUMMARY

The probe card is able to carry high-frequency signals without adding noise to such signals, ensuring at the same time a proper operation during the contact of its contact probes with the contact pads of a device to be tested, avoiding the breakage of the contact probes and of the contact pads, so overcoming the problems tied to the prior art solutions.

According to an aspect of the disclosure the probe card is provided with micro contact probes adapted to contact a device to be tested, each of those micro contact probes having an end portion abutting onto an end of a respective strip of a plurality of strips formed in a flexible membrane of the probe card, wherein contact elements of a testing head of the probe card also have an end portion abutting onto such end of the strips but onto an opposite face of the flexile membrane, in this way acting as damping support elements for the corresponding micro contact probes, the end portion of those strips moving during the contact of the micro contact probes with the device to be tested.

The probe card for a testing apparatus of electronic devices, comprises a testing head, which houses a plurality of contact elements extending along a longitudinal axis between a first end portion and a second end portion, a support plate, onto which the first end portion is adapted to abut, and a flexible membrane which comprises a first face and a second and opposite face, the probe card being characterized in that a first portion of the flexible membrane is arranged on at least one support and comprises a plurality of strips extending between a proximal end and a distal end, the probe card further including a plurality of micro contact probes comprising a body extending along the longitudinal axis between a first end portion and a second end portion, the second end portion of each contact element abutting onto the first face of the flexible membrane at the distal end of a respective strip, and the first end portion of each micro contact probe abutting onto the second face of the flexible membrane at a respective contact element, the flexible membrane being electrically connected to the support plate through a second portion thereof, the second end portion of the micro contact probes being apt to contact the contact pads of a device to be tested, wherein the at least one support is provided with a plurality of guide holes for the housing of the plurality of micro contact probes.

More particularly, the probe card comprises the following additional characteristics, taken individually or in combination if required.

According to an aspect of the disclosure, the probe card can further comprise retaining means adapted to keep in place the flexible membrane.

According to an aspect of the disclosure, the retaining means can comprise a further support provided with a plurality of further guide holes for the housing of the contact elements, the flexible membrane being arranged between the support and the further support, a gap being defined between the support and the further support to allow a movement of the distal end of the strips during the contact of the second end portion of the micro contact probes with the contact pads of the device to be tested.

According to another aspect of the disclosure, the gap between the support and the further support can be formed by a recess made in the further support, or the further support can be divided into a first plate-like element, which comprises a central opening, and a second plate-like element, which is on the top of the first plate-like element, the gap being defined by the central opening of the first plate-like element.

Moreover, the guide holes of the support can comprise a recessed portion that forms a shoulder in the support.

According to an aspect of the disclosure, the support can comprise at least one first and at least one second plate-like element, which are overlapped and integral with each other, the first plate-like element being provided with openings having a larger diameter with respect to corresponding openings of the second plate-like element, the openings of the first plate-like element being concentrically overlapped with the openings of the second plate-like element, those overlapped openings forming the guide holes of the support provided with the recessed portion.

According to another aspect of the disclosure, the distal end of each strip of the flexible membrane can comprise an opening, the first end portion of the micro contact probes comprising an engagement portion engaging with the opening, wherein the engagement portion comprises a first member and a second member separated by a space, those members being adapted to be inserted into the opening and to be moved one towards the other by the walls of the opening.

According to another aspect of the disclosure, the micro contact probes can have a length lower than a length of the contact elements, preferably at least less than 500 µm, this length being measured along the longitudinal axis.

Moreover, the flexible membrane can include conductive tracks extending from the distal end of the strips.

It is observed that the distal end of each strip can comprise, on the second face, a lower contact pad or a lower conductive layer onto which the first end portion of the micro contact probes abuts, the conductive tracks extending from the lower contact pad of from the conductive layer.

According to an aspect of the disclosure, the conductive tracks of the flexible membrane can be electrically connected to contact pads of the support plate.

According to another aspect of the disclosure, the flexible membrane and the support plate can be electrically connected to each other by means of a pressing contact, a conductive rubber or a weld.

According to another aspect of the disclosure, the conductive tracks can extend along the first and/or second face of the flexible membrane and/or can extend within the flexible membrane.

According to another aspect of the disclosure, the distal end of each strips can comprise, on the first face, an upper contact pad or an upper conductive layer onto which the second end portion of the contact elements abuts.

According to an aspect of the disclosure, the upper conductive layer can comprise at least one lowered portion for the housing of the second end portion of the contact elements.

According to an aspect of the disclosure, the support plate can be a printed circuit board apt to be connected with the testing apparatus.

Moreover, the support can be made of a ceramic material.

According to an aspect of the disclosure, the probe card can comprise further contact elements which are apt to carry power signals and/or ground signals and/or low frequency signals between the device to be tested and the support plate. In this case, the support can comprise a plurality of further guide holes for the housing of the further contact elements.

According to another aspect of the disclosure, the contact elements of the testing head can comprise a group of contact elements, each contact element of this group being electrically connected to a corresponding micro contact probe, the contact elements not included in this group being electrically insulated from the micro contact probes and from the contact elements of this group, the contact elements of this group being adapted to carry power signals and/or ground signals and/or low frequency signals.

In this case, each contact element of this group can be electrically connected to a corresponding micro contact probe by means of connection conductive tracks formed in the flexible membrane, the connection conductive tracks extending between the first face and the second face of the flexible membrane.

Moreover, the testing head can comprise at least one guide provided with a plurality of guide holes within which the contact elements are slidingly housed.

According to an aspect of the disclosure, the first end portion of the micro contact probes can include a beveled portion at an upper edge thereof.

According to another aspect of the disclosure, the first end portion of the micro contact probes can have a diameter greater than a diameter of the body of the micro contact probes, the term diameter meaning a maximum transverse dimension. In particular, the diameter of the body can be variable along the longitudinal axis, the body being rod-shaped and comprising an enlarged portion within which its diameter has a maximum value at the first end portion, this diameter decreasing within the enlarged portion along the longitudinal axis away from the first end portion and being constant outside the enlarged portion.

Moreover, the first portion of the flexible membrane can be a central portion thereof, while the second portion of the flexible membrane can be a peripheral portion thereof.

According to yet another aspect of the disclosure, the strips can comprise a lifted portion.

Finally, the probe card can comprise strips having a different length, this length being measured along an axis of the strips.

The features and advantages of the probe card according to the disclosure will become apparent from the following description of an embodiment thereof, given by way of non-limiting example with reference to the accompanying drawings.

DETAILED DESCRIPTION

Figure 1:
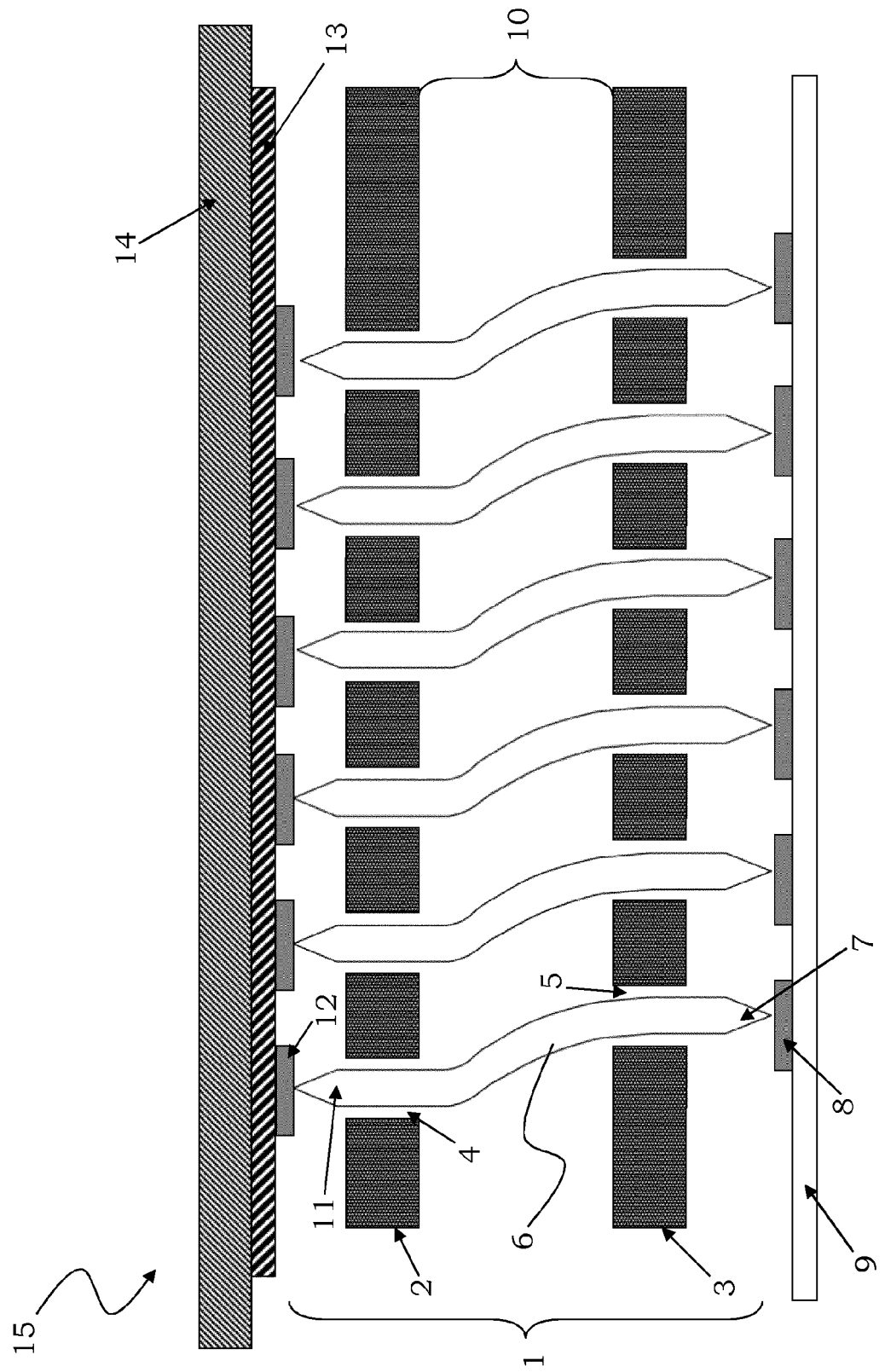
FIG. 1 schematically shows a probe card according to the prior art.
Figure 2A:
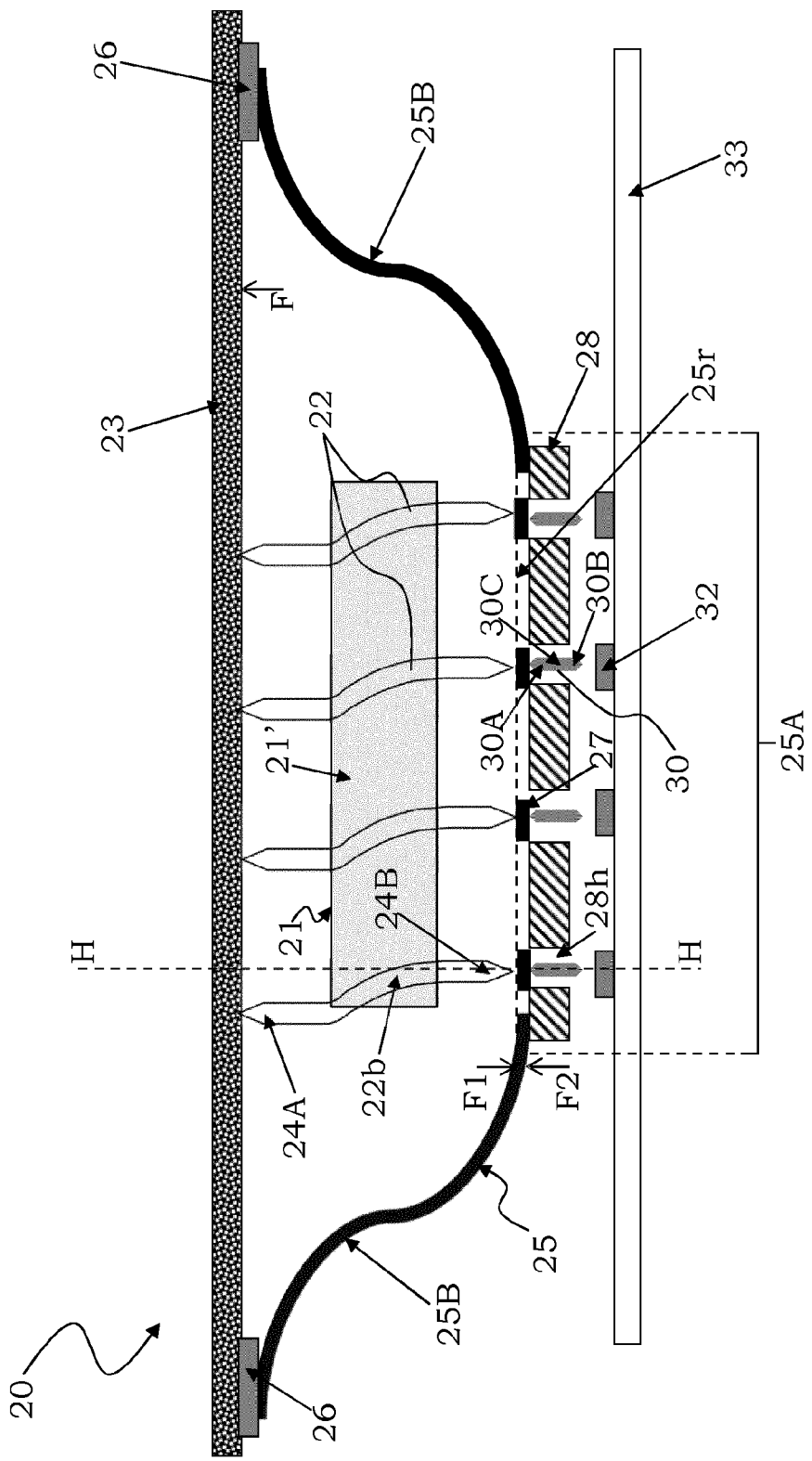
FIG. 2A schematically shows a probe card according to the disclosure.

With reference to those figures, and in particular to the example of FIG. 2A, a probe card according to the disclosure is globally and schematically indicated with 20.

It is worth noting that the figures represent schematic views and are not drawn to scale, but instead they are drawn so as to emphasize the important features of the disclosure. Moreover, in the figures, the different elements are depicted in a schematic manner, their shape varying depending on the application desired. It is also noted that in the Figures the same reference numbers refer to elements that are identical in shape or function. Finally, particular features described in relation to an embodiment illustrated in a Figure are also applicable to the other embodiments illustrated in the other Figures.

In its more general form, the probe card 20 is adapted to connect with an apparatus (not shown in the Figures) for testing electronic devices that are integrated on a semiconductor wafer.

The probe card 20 comprises a testing head 21, which houses a plurality of contact elements 22, four of said contact elements 22 being shown in FIG. 2A just by way of example.

In general, the testing head 21 comprises a main body 21' intended to house the contact elements 22, the main body 21' thus being the support structure of the contact elements 22.

The probe card 20 further comprises a support plate 23, which is preferably a printed circuit board (PCB) that ensures the connection between the probe card 20 and the testing apparatus.

The contact elements 22 comprise a body 22b, which extends along a longitudinal axis H-H between a first end portion 24A and a second end portion 24B, the first end portion 24A being adapted to abut onto the support plate 23.

The probe card 20 further comprises a flexible membrane 25, which has a first face F1, onto which the second end portion 24B of the contact elements 22 is adapted to abut, and a second face F2, opposite the first face F1, the second face F2 being a lower face according to the local reference system of FIG. 2A, namely a face facing a device under test, and the first face F1 being an upper face according to the local reference system of FIG. 2A, namely a face facing the testing head 21.

Suitably, the testing head 21 is interposed between the flexible membrane 25 and the support place 23.

Specifically, the flexible membrane 25 comprises a first portion or central portion 25A and a second portion or peripheral portion 25B, which are intended to contact the testing head 21 and the support plate 23, respectively.

The flexible membrane 25 is electrically connected to the support plate 23 by means of the peripheral portion 25B thereof, said electric connection occurring for instance by means of suitable conductive contact pads 26 of the support plate 23 and of suitable contact pads or conductive portions (not shown) formed on the flexible membrane 25 at its peripheral portion 25B, as it will be illustrated in the following.

As shown in FIG. 2A, the contact pads 26 of the support plate 23 are formed on a face F thereof facing the testing head 21, the face F being a lower face according to the local reference system of FIG. 2A.

In an embodiment not shown in the Figures, the support plate 23 can comprise suitable openings in order to allow the passage of the flexible membrane 25 therethrough, said flexible membrane 25 being in this case connected to contact pads (not shown) formed on a face opposite to the face F of the support plate 23, namely on an upper face according to the local reference system of FIG. 2A. Alternatively, the flexible membrane 25 can be directly connected to the testing apparatus.

In a preferred embodiment of the disclosure, conductive portions of the flexible membrane 25 are connected to the contact pads 26 of the support plate 23 by means of a pressing contact. Alternatively, the flexible membrane 25 and the support plate 23 can be associated by means of a conductive rubber or a weld.

As shown in FIG. 2A, while the peripheral portion 25B of the flexible membrane 25 contacts the support plate 23, its central portion 25A is associated with at least one support 28, which is preferably plate-shaped.

In a preferred embodiment of the disclosure, the support 28, whereon the flexible membrane 25 is arranged, comprises a plurality of guide holes 28h adapted to slidingly house a plurality of micro contact probes 30, which are adapted to contact the contact pads 32 of a device under test on a semiconductor wafer 33, the flexible membrane 25 being interposed between the contact elements 22 and said micro contact probes 30.

Figure 2B:
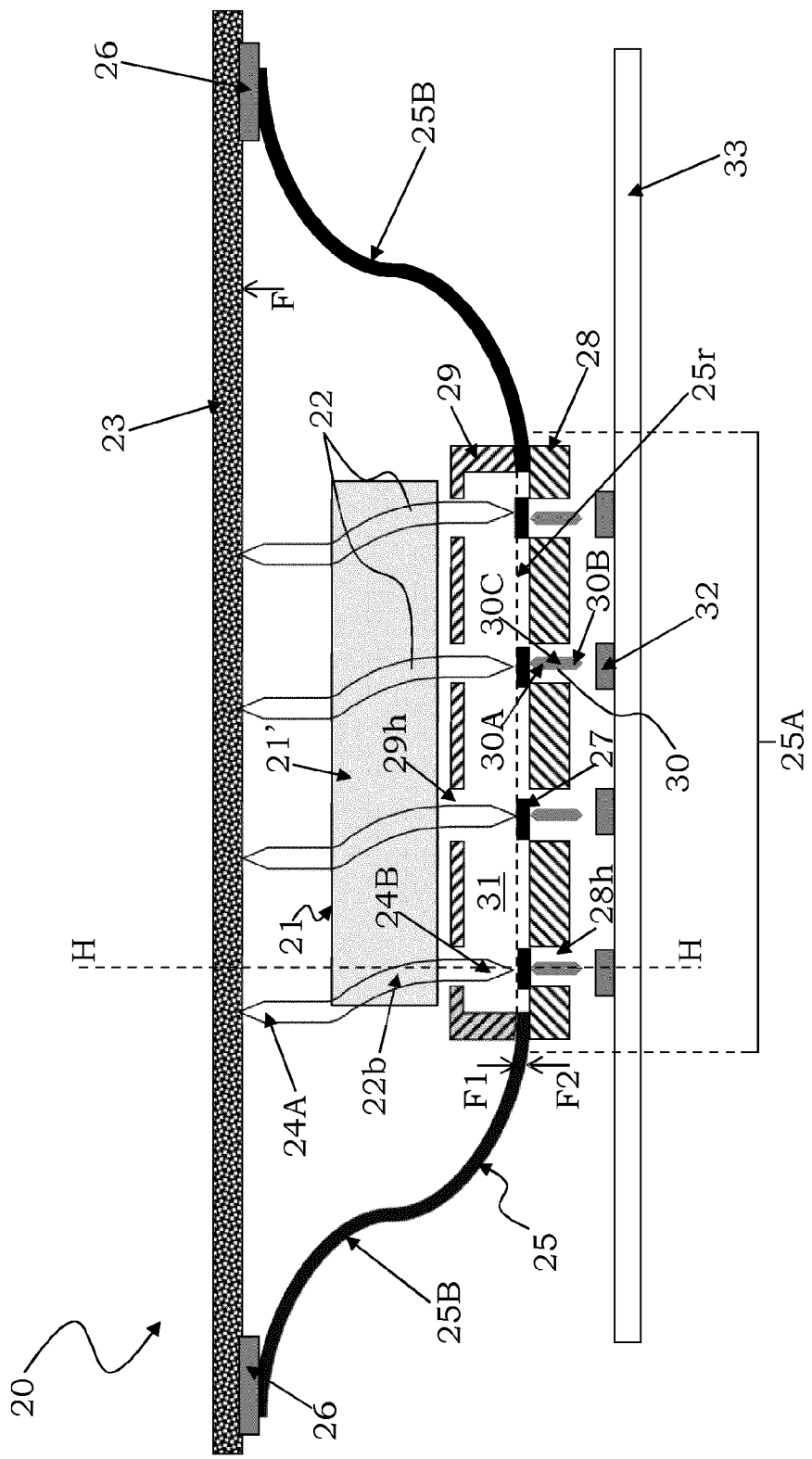
FIG. 2B schematically shows a probe card according to a preferred embodiment of the disclosure.

As shown in FIG. 2B, the probe card 20 according to the disclosure further comprises suitable retaining means 29 adapted to keep in place the flexible membrane 25. The proper holding of the flexible membrane 25 in the probe card 20 during operation is thus ensured, in particular it is ensured that the flexible membrane 25 is always kept taut and in its correct position on the support 28, avoiding for instance an undesired movement thereof when the micro contact probes 30 contact the contact pads 32 of the testing device.

In a preferred embodiment of the disclosure illustrated in FIG. 2B, the retaining means 29 are in the form of a further support, still indicated with the reference number 29, the flexible membrane 25 being interposed between the support 28 and said further support 29.

The further support 29 comprises a plurality of further guide holes 29h which adapted to house the contact elements 22. Alternatively, the further support 29 can comprise only one opening for all the contact elements 22.

The micro contact probes 30 comprise a body 30C that extends along the longitudinal axis H-H between a first end portion 30A and a second end portion 30B, said second end portion 30B being adapted to contact the contact pads 32 of the device under test integrated on the semiconductor wafer 33.

Advantageously according to the disclosure, the flexible membrane 25 is suitably shaped so as to include, preferably in its central portion 25A, a plurality of strips or fingers 27 (i.e. cutouts in the flexible membrane 25).

Figure 3:
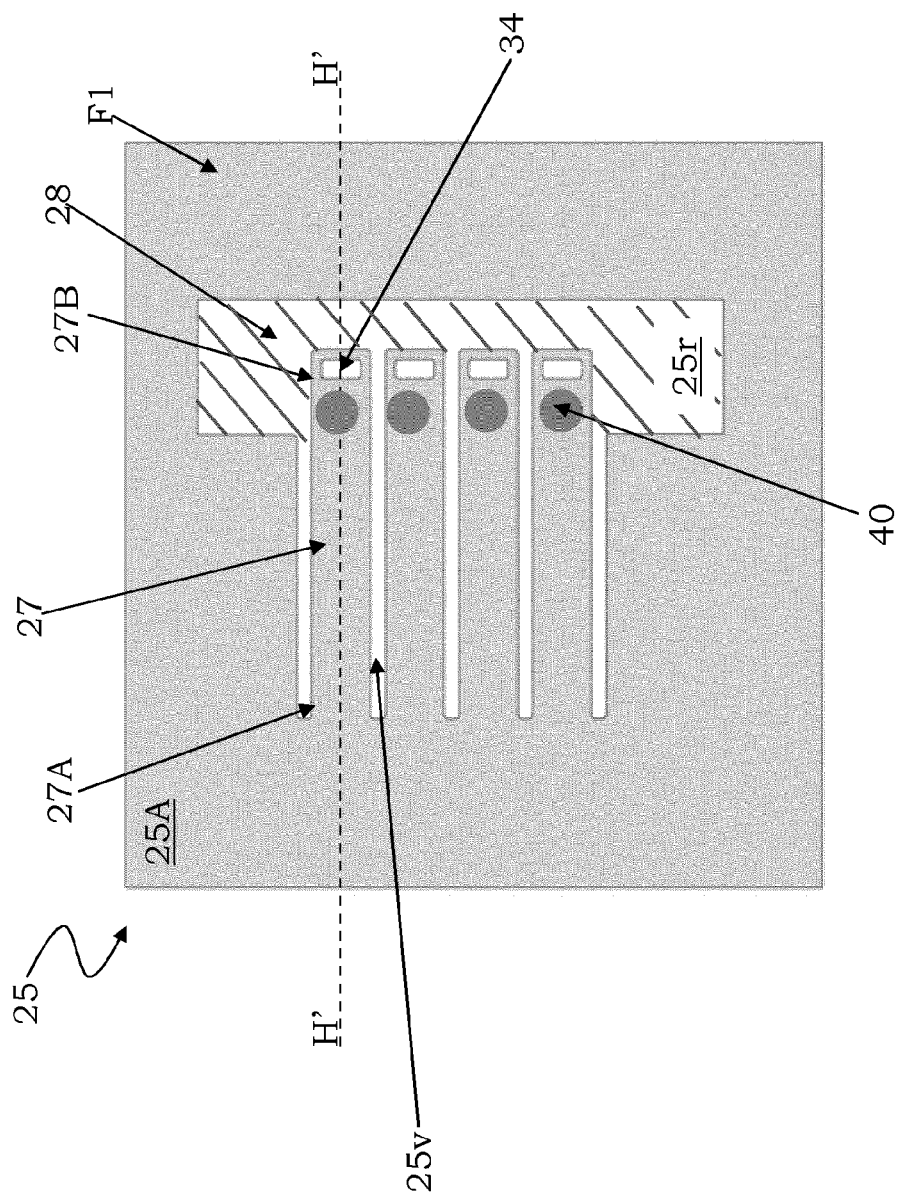
FIG. 3 shows a schematic top view of a portion of the probe card of FIGS. 2A and 2B, in particular showing a portion of a flexible membrane arranged on a support.

In particular, as shown in greater detail in FIG. 3, the strips 27 protrude and extend in the central portion 25A of the flexible membrane 25 along an axis H'-H', which is substantially orthogonal to the axis H-H, between a first end or proximal end 27A, connected to the flexible membrane 25, and a second end or distal end 27B, which protrudes and is not connected to any portion of the flexible membrane 25.

In other words, the flexible membrane 25 has at least one opening 25r, preferably formed in the central portion 25A thereof, in which the strips 27 extend, the distal end 27B of those strips being thus free, wherein a suitable gap 25v is defined between adjacent strips and separates them.

Still referring to FIG. 3, the distal end 27B of each strip 27 comprises, on the first face F1 facing the testing head 21, an upper contact pad 40, preferably made of a metal material, onto which the second end portion 24B of the contact elements 22 abuts.

Figure 4A:
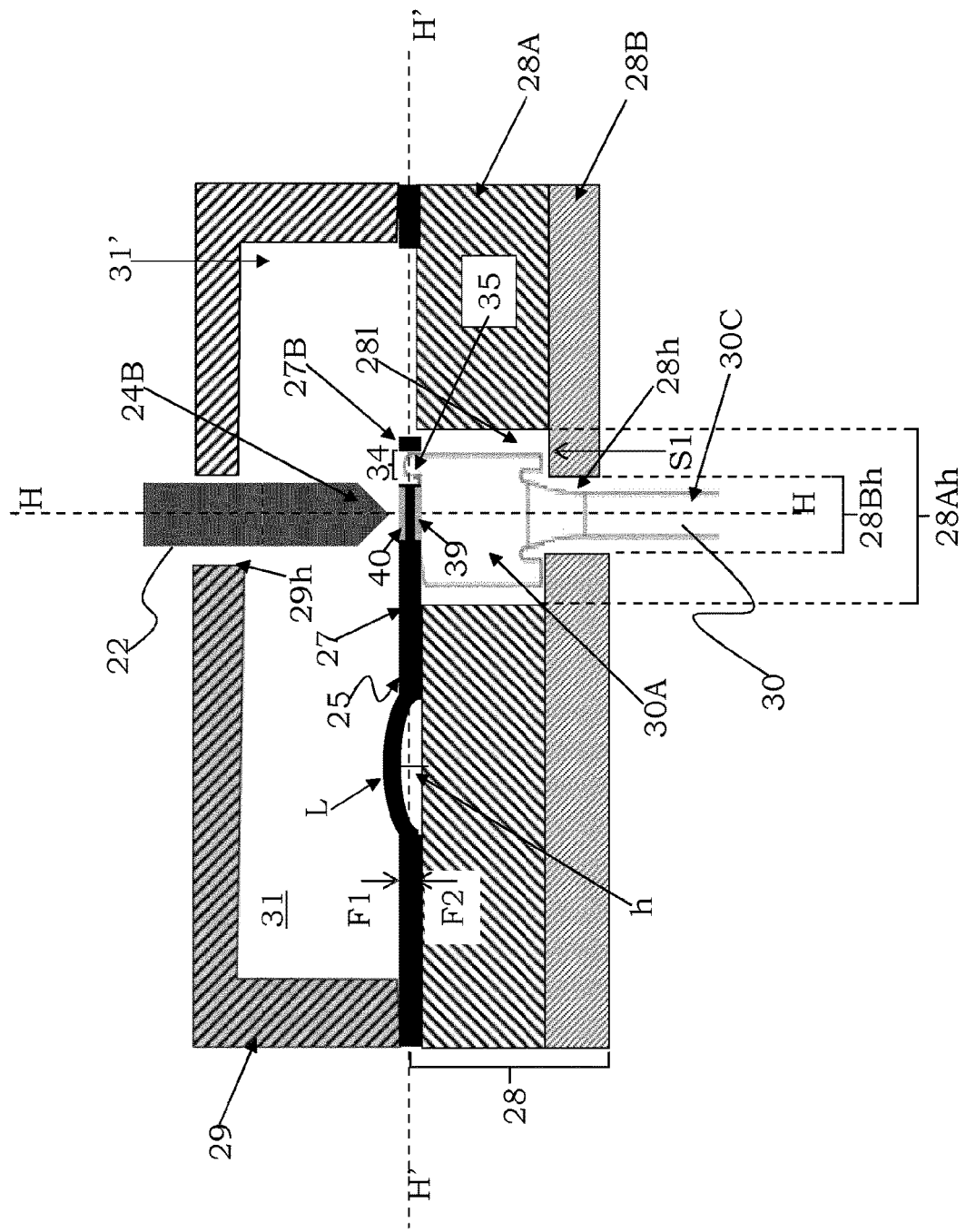
FIG. 4A shows a lateral view of a detail of the probe card of FIG. 2B.

As shown in greater detail in FIG. 4A, which shows a lateral view of a portion of the probe card 20 of FIG. 2B, the second end portion 24B of each contact element 22 abuts onto the first face F1 of the flexible membrane 25, at the distal end 27B of a respective strip 27. Likewise, the first end portion 30A of each micro contact probe 30 abuts onto the second face F2 of the flexible membrane 25, still at said distal end 27B.

In other words, the second end portion 24B of the contact elements 22 and the first end portion 30A of the micro contact probes 30 both abut onto the distal end 27B of a same respective strip 27 of the flexible membrane 25, but on opposite sides of such strip 27, namely onto the first face F1 and onto the second face F2 of the flexible membrane 25, respectively. In this way, suitably, while the contact elements 22 abut onto the first face F1 of the flexible membrane 25 by means of the second end portion 24B thereof, in particular at the distal end 27B of a respective strip 27, the micro contact probes 30 abut onto the second face F2 of the flexible membrane 25 by means of the first end portion 30A thereof, in particular at a respective contact element 22.

Suitably, the micro contact probes 30 have a length much lower than the length of the contact probes used in the known solutions, in particular they have a length at least lower than 500 µm. It should be noted that, in the present description, the term "length" means a dimension of the micro contact probes 30 and of the contact elements 22 measured in a direction parallel to the longitudinal axis H-H.

It is thus clear that the micro contact probes 30 of the probe card 20 of the disclosure are adapted to test high-frequency devices, the length thereof being such as to avoid disadvantageous self-inductance phenomena.

According to the embodiment of FIGS. 2A, 2B, 3 and 4A, each contact element 22 abuts onto the first face F1 of a strip 27 of the flexible membrane 25 at the first end portion 30A of a respective micro contact probe 30, which in turn abuts onto the second face F2 of the flexible membrane 25. In particular, the number of contact elements 22 in this case corresponds to the number of the micro contact probes 30, thus resulting in a one-to-one correspondence between said contact elements 22 and said micro contact probes 30. In other words, each micro contact probe 30 corresponds to a respective contact element 22, which abuts onto the flexible membrane 25 but onto the opposite face thereof. As it will be clarified in the following, the contact elements 22 act as damping elements for the micro contact probes 30, which carry the signals between the probe card 20 and the device under test integrated on the wafer 33.

It should be noted that, in this embodiment, the contact elements 22 are electrically insulated from the micro contact probes 30, in particular thanks to the flexible membrane 25 interposed therebetween.

Still referring to FIG. 4A, the support 28 and the further support 29 are such as to allow a vertical movement along the longitudinal axis H-H of the strips 27, in particular of their distal end 27B.

Specifically, a gap 31 is defined between the support 28 and the further support 29, such as to allow the movement of the distal end 27B of the strips 27 when the second end portion 30B of the micro contact probes 30 contacts the contact pads 32 of the device under test.

In a preferred embodiment of the disclosure, still illustrated in FIG. 4A, the further support 29 comprises a recess 31' that forms the gap 31 between the support 28 and said further support 29, the strips 27 moving inside this gap 31.

As a result, thanks to the gap 31, the distal ends 27B of the strips 27, which are flexible, are free to move under the pressure of the micro contact probes 30 when they contact the contact pads 32 of the device under test.

The recess 31' can be formed by means of a lowering process of the further support 29. Alternatively, in an embodiment not shown in the Figures, the further support 29 can be divided into a first plate-like element, which contacts the flexible membrane 25 and comprises a central opening, and into a second plate-like element, which is on the top of said first plate-like element and comprises the holes for housing the contact elements 22, the gap 31 being in this case defined by the central opening of the first plate-like element.

When the micro contact probes 30 contact the device under test, the contact elements 22 act as damping elements (i.e. as shock absorbers), adjusting the contact force exerted on the contact pads 32 of the device under test.

It is in fact observed that the contact elements 22 of the testing head 21 have a length generally between 1.5 mm and 10 mm, i.e. a length much greater than that of the micro contact probes 30 which, as previously seen, is lower than 500 μm, and therefore they have a much greater bending capacity, such as to ensure the aforementioned damping effect.

Suitably, the contact elements 22 are made of materials suitable for maximizing the damping effect for the micro contact probes 30.

Furthermore, it should be noted that each contact element 22 moves independently of the adjacent ones, so that each micro contact probe 30 moves independently of the adjacent ones when they contact the contact pads 32 of the device under test. This, along with the flexibility of the flexible membrane 25, and in particular of the strips 27 thereof, allows effectively compensating possible differences in level of the device under test, in particular of the contact pads 32 thereof.

It should also be noted that the contact elements 22 also act as pre-loading elements that keep the flexible membrane 25, in particular the distal end 27B of the strips 27, under pressure against the first end portion 30A of the micro contact probes 30, the contact elements 22 thus also ensuring the correct mechanical coupling between the micro contact probes 30 and the flexible membrane 25.

As clear from FIGS. 3 and 4A, the distal end 27B of the strips 27 of the flexible membrane 25 comprises an opening 34, while the first end portion 30A of the micro contact probes 30 comprises a protruding portion 35 that engages said opening 34, allowing in this way a better coupling between the micro contact probes 30 and the flexible membrane 25, said protruding portion 35 being formed on the top of the first end portion 30A of the micro contact probes 30, in particular at an upper edge of the first end portion 30A, said upper edge being the most faraway one from the proximal portion 27A of the strips 27 when the micro contact probe 30 is associated with the respective strip 27.

The protruding portion 35, engaging with the opening 34 of the strips 27, also acts as a barrier or containment element for said strips 27, allowing the formation of a lifted portion L thereof. In particular, the arrangement of the micro contact probes 30 (which are associated with the distal end 27B of the strips 27) with respect to the proximal end 27A of the strips 27 determines the presence of the lifted portion L. The height h of the lifted portion L, which is measured along the axis H-H with respect to the plane where the flexible membrane 25 lies, is suitably calibrated so that, during the overtravel, the distal end 27B of the strips 27 lifts, thus avoiding excessive traction stresses for the flexible membrane 25. By way of non-limiting example, for a maximum overtravel of 100 μm, the height h of the lifted portion L is suitably calibrated so that, during the overtravel, the distal end 27B of the strips 27 lifts by at least 15 μm.

Suitably, the distal end 27B of each strip 27 comprises, on the second face F2, a lower contact pad 39, which is made of a metallic material and onto which the first end portion 30A of the micro contact probes 30 abuts, wherein conductive tracks extend from the lower contact pad 39, as it will be shown below.

More particularly, the contact pads 39 and 40 of the flexible membrane 25 are formed in its central portion 25A, which therefore is a contact area of said flexible membrane 25, said contact area substantially corresponding to an area of the device under integrated on the wafer 33 comprising the contact pads 32, the peripheral portion 25B of the flexible membrane 25 being a portion external to this contact area.

The lower contact pads 39 and the upper contact pads 40 are further useful for reinforcing the strips 27 of the flexible membrane 25, in particular they are adapted to damp the abutment of the second end portion 24B of the contact elements 22 and of the first end portion 30A of the micro contact probes 30 onto the flexible membrane 25, substantially acting as a protective structure for said flexible membrane 25 at the strips 27, in particular at the distal end 27B thereof. Moreover, the lower contact pads 39 also allow the passage of the signals from the micro contact probes 30 to conductive tracks of the flexible membrane 25.

Figure 4B:
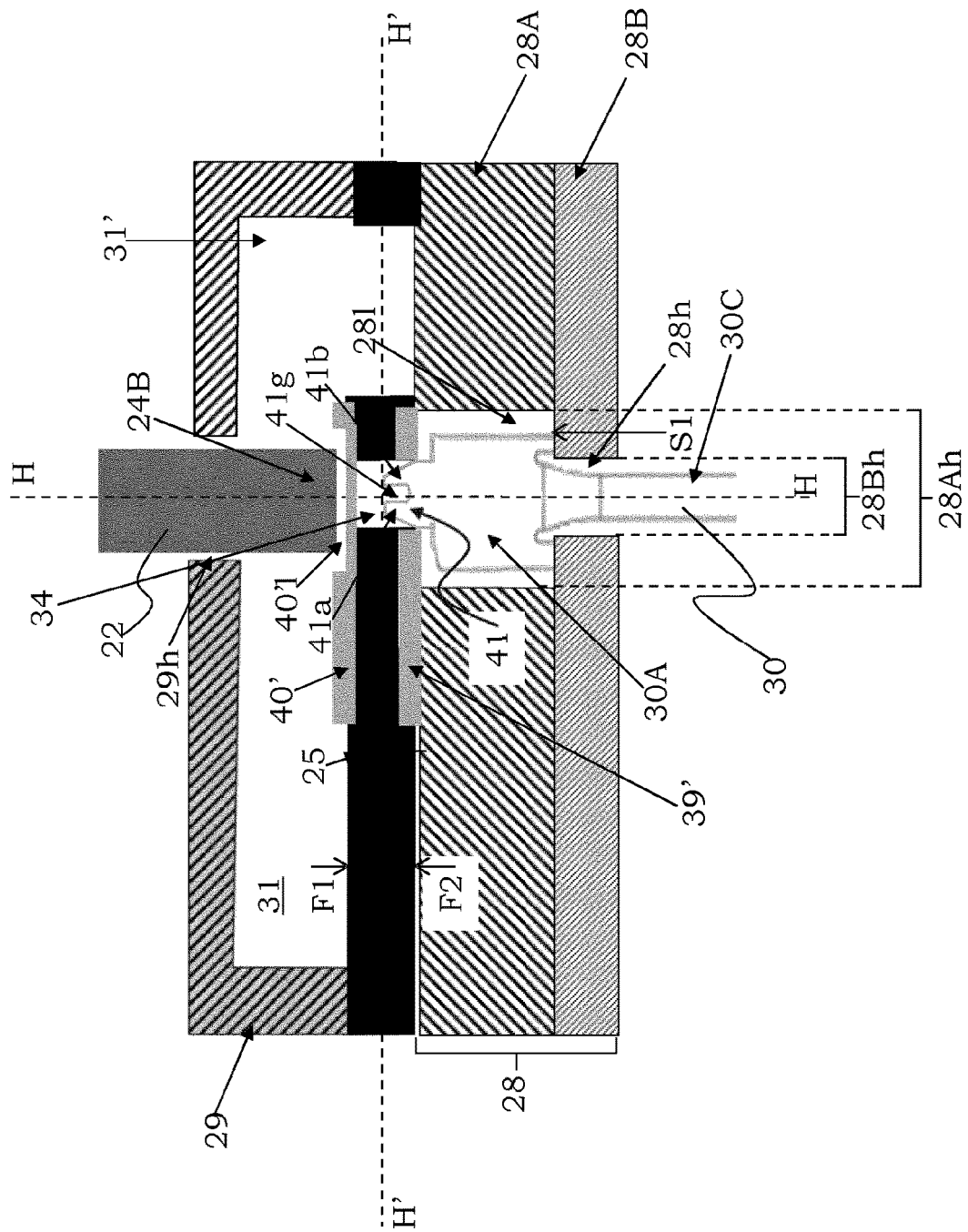
FIG. 4B shows a lateral view of a detail of a probe card according to an alternative embodiment of the disclosure.

In a preferred embodiment of the disclosure, the association between the micro contact probes 30 and the membrane 25 is performed by means of a clip-like attachment. In particular, as shown in FIG. 4B, the first end portion 30A of the micro contact probes 30 comprises, on the top thereof, an engagement portion 41 adapted to engage with the opening 34 of the flexible membrane 25, such an engagement portion 41 comprising a first member 41a and a second member 41b separated by a space 41g, so that when the engagement portion 41 is inserted into the opening 34 of the flexible membrane 25, the first member 41a and the second member 41b are moved one towards the other by the lateral (i.e. transversal) force exerted by the walls of the opening 34, and the space 41g is reduced accordingly. The flexible membrane 25 and the members 41a and 41b of the engagement portion 41 therefore exert opposite lateral forces that contribute to the holding of the micro contact probe 30, such an engagement portion 41 therefore acting as a clip.

Moreover, instead of the contact pads 39 and 40, it is possible to provide the presence of conductive layers 39' and 40' on the flexible membrane 25, as shown in FIG. 4B. In this case, the conductive layer 40' on the face F1 facing the contact element 22 is provided with at least one lowered portion 40'l at the opening 34 of the membrane 22, such a lowered portion 40'l being a housing seat for the second end portion 24B of the contact element 22, which abuts onto this housing seat. In an embodiment of the disclosure not shown in the Figures, the lowered portion 40'l can be in the form of a through hole and the second end portion 24B of the contact element 22 abuts directly onto the flexible membrane 25.

Still referring to FIGS. 4A and 4B, the guide holes 28*h* of the support 28 comprise a recessed portion 281 that forms a shoulder S1 in each of these guide holes 28*h*.

In a preferred embodiment of the disclosure, still illustrated in FIGS. 4A and 4B, the support 28 comprises at least one first and one plate-like element, indicated as 28A and 28B, respectively, which are overlapped to and integral with each other.

More particularly, the first plate-like element 28A is provided with openings 28A*h* having a diameter greater than corresponding openings 28B*h* of the second plate-like element 28B, so that when said openings 28A*h* and 28B*h* of the first and second plate-like element are concentrically overlapped, they form the guide holes 28*h* of the support 28, which are provided with the recessed portion 281 previously mentioned.

It should be noted that, in the present description, the term "diameter" means a maximum transverse dimension.

The thicknesses of the plate-like elements 28A and 28B may vary according to the needs and/or circumstances. By way of example, the thickness of the first plate-like element 28A may vary from 150 to 200 μm, preferably 150 μm, whereas the thickness of the second plate-like element 28B may vary from 80 to 150 μm, preferably 100 μm. The thickness of the further support 29, if any, may vary from 200 to 400 μm, preferably 250 μm.

The plate-like elements 28A and 28B can be made of the same material or of different materials. Furthermore, it is possible to provide a support 28 comprising a number of plate-like elements greater than two.

Figure 5B:
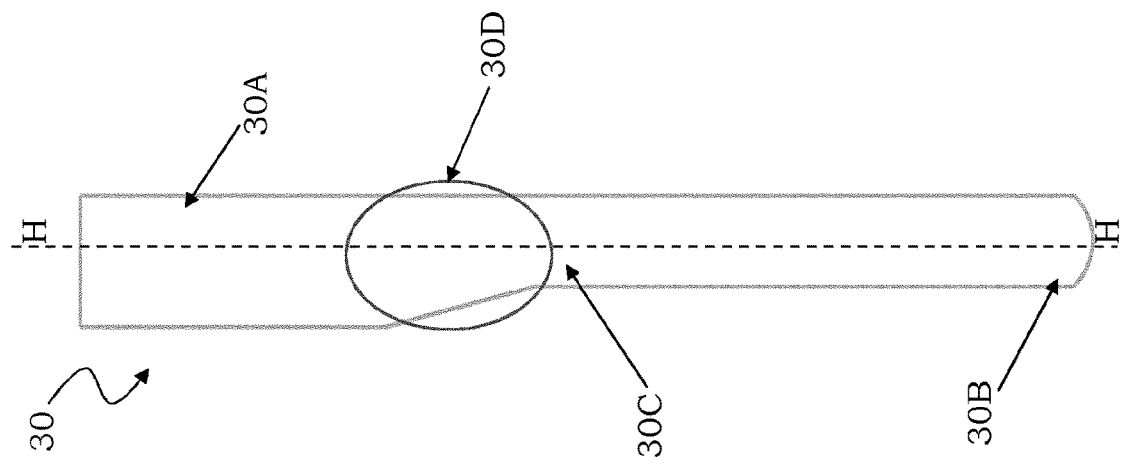
FIGS. 5A and 5B show different views of a micro contact probe of the probe card according to the disclosure.
Figure 5A:
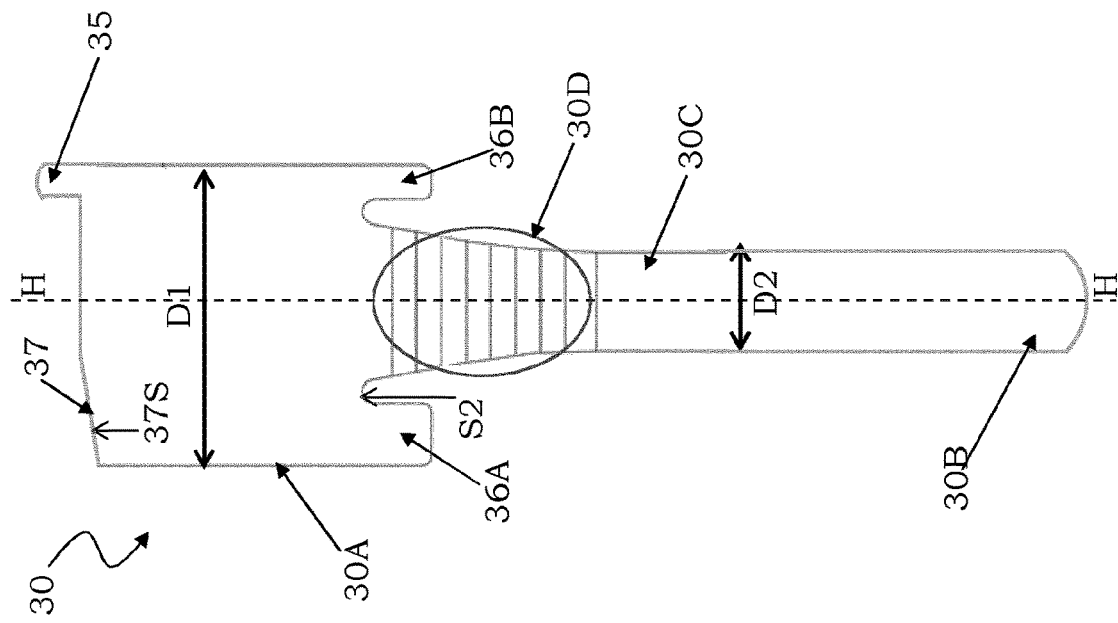

Referring to FIG. 5A, the first end portion 30A of the micro contact probes 30 has a diameter D1 greater than the diameter D2 of the body 30C of the micro contact probes 30, so as to facilitate the association between the distal end 27B of the strips 27 and such first end portion 30A.

The first end portion 30A of the micro contact probes 30, which has the diameter D1 greater than the diameter D2 of the body 30C, defines a surface S2 from which a first and a second protruding portions protrude, such protruding portions being indicated as 36A and 36B, respectively. In other words, the first and second protruding portions 36A and 36B protrude from the surface S2 of the first end portion 30A towards the shoulder S1 of the guide holes 28*h* without abutting thereonto. In particular, a calibrated gap, usually of a few μm, is present between the first and second protruding portions 36A and 36B and the shoulder S1.

Furthermore, the first end portion 30A of the micro contact probes 30 comprises a beveled portion 37 on the top thereof. In particular, the beveled portion 37 is formed at an upper edge of the first end portion 30A, this edge being the closest one to the proximal portion 27A of the strips 27 when the micro contact probe 30 is associated with the respective strip 27. In other words, the beveled portion 37 is formed at the opposite edge with respect to the protruding portion 35, if any.

The beveled portion 37 defines, on top of the first end portion 30A, an inclined surface 37S onto which the strip 27 lies when the micro contact probes 30 contact the pads 32 of the device under test, namely during the vertical movement or overtravel of the micro contact probes 30. In this way, thanks to the beveled portion 37, damage to the flexible membrane 25 is avoided during the overtravel, since the flexible membrane 25 is prevented from resting onto a sharp corner.

Furthermore, as visible from FIGS. 5A and 5B, the body 30C of the micro contact probes 30 is a rod-like body suitably tapered. In particular, the diameter D2 of the body 30C of the micro contact probes 30 is variable along the longitudinal axis H-H, so that the body 30C has a cross-section that is not constant along this longitudinal axis H-H.

More in particular, the diameter D2 is maximum at the first end portion 30A and is greater than that of the opening 28B*h* of the second plate-like element 28B, said diameter D2 decreasing along the longitudinal axis H-H from the first end portion 30A towards the second end portion 30B, until it has a constant value. In other words, the body 30C of the micro contact probes 30 comprises an enlarged portion 30D, formed in a portion thereof that is close proximity to the first end portion 30A, wherein the diameter D2 has a maximum value at this first end portion 30A and decreases away from it, the diameter D2 being constant outside this enlarged portion 30D, in particular less than the diameter of the opening 28B*h* of the second plate-like element 28B.

The variable diameter D2 is obtained by beveling at least one of the four walls of the body 30C of the micro contact probes 30, preferably two walls. For instance, the enlarged portion 30D, inside which the diameter D2 is variable, can comprise two faces inclined towards the inside of the rod-like body 30C, these faces being inclined from the lower surface of the first end portion 30A. These faces possibly have a concavity and are preferably two contiguous faces, the remaining faces being parallel to each other.

Suitably, the shape of the body 30C of the micro contact probes 30 on the one hand avoids them from being stuck in the guide holes 28*h*, and on the other hand it reduces the clearance between them and the walls of said guide holes 28*h*, in particular the walls of the openings 28B*h* of the second plate-like element 28B.

The retention of the micro contact probes 30 within the guide holes 28*h* is obtained thanks to the abutment of the inclined faces of the enlarged portion 30D against the edges of the shoulder S1. In the case of wear of these faces, the retention is obtained thanks to the abutment of the first and second protruding portions 36A and 36B against the shoulder S1 of the guide holes 28*h*.

Furthermore, the shape of the body 30C allows the micro contact probes 30 to be repositioned, under the load of the pre-loading contact elements 22, in the same operating position after they have contacted the contact pads 32 of the device under test.

It should be pointed out that the embodiments of FIGS. 4A, 4B, 5A and 5B is provided only by way of non-limiting example of the disclosure, since the micro contact probes 30 can be of any suitable shape.

Figure 6:
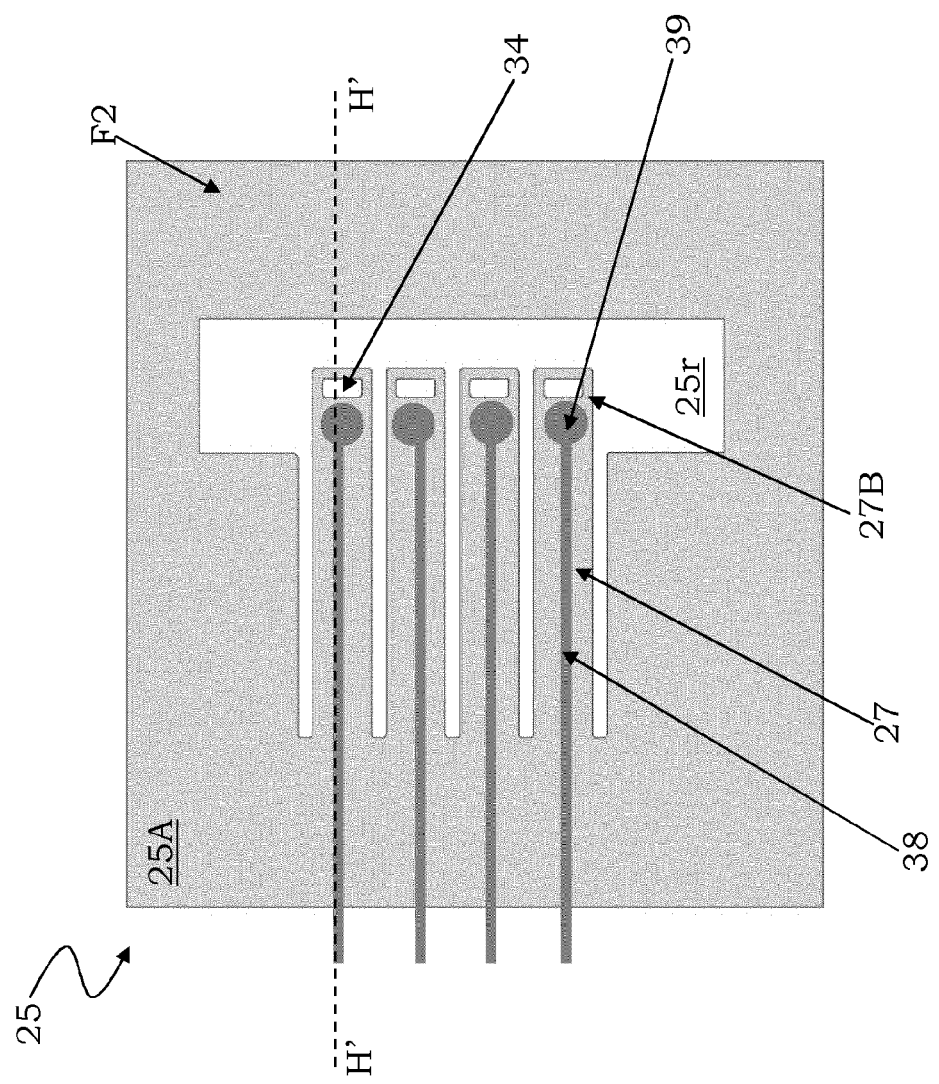
FIG. 6 shows a top view of a portion of the flexible membrane of the probe card of the disclosure, in particular of a face thereof opposite the one shown in FIG. 3.

Referring now to FIG. 6, the flexible membrane 25 comprises suitable conductive tracks 38 for carrying and routing signals between the device under test and the support plate 23, as it was previously mentioned. Specifically, the conductive tracks 38 extend from the distal end 27B of the strips 27, in particular from the strip point at which the first end portion 30A of the micro contact probes 30 abuts.

As a result, the flexible membrane 25 provides for the routing of the signals towards the PCB by means of the conductive tracks 38, and therefore it also performs the function generally performed by the space transformers of the known probe cards.

Obviously, it is possible for the probe card 20 to further comprise an additional board having the function of space transformer, so that the routing of the signals can be performed both by the conductive tracks 38 of the flexible membrane 25 and by this space transformer.

In the embodiments shown in FIGS. 2A-2B, 3, 4A, 4B and 6, the contact elements 22 are not adapted to carry signals but are included only as damping elements of the probe card 20, so as to overcome the problem of the rigidity of the micro contact probes 30 and to avoid the breakage thereof during the contact with the contact pads 32 of the device under test.

Figure 7:
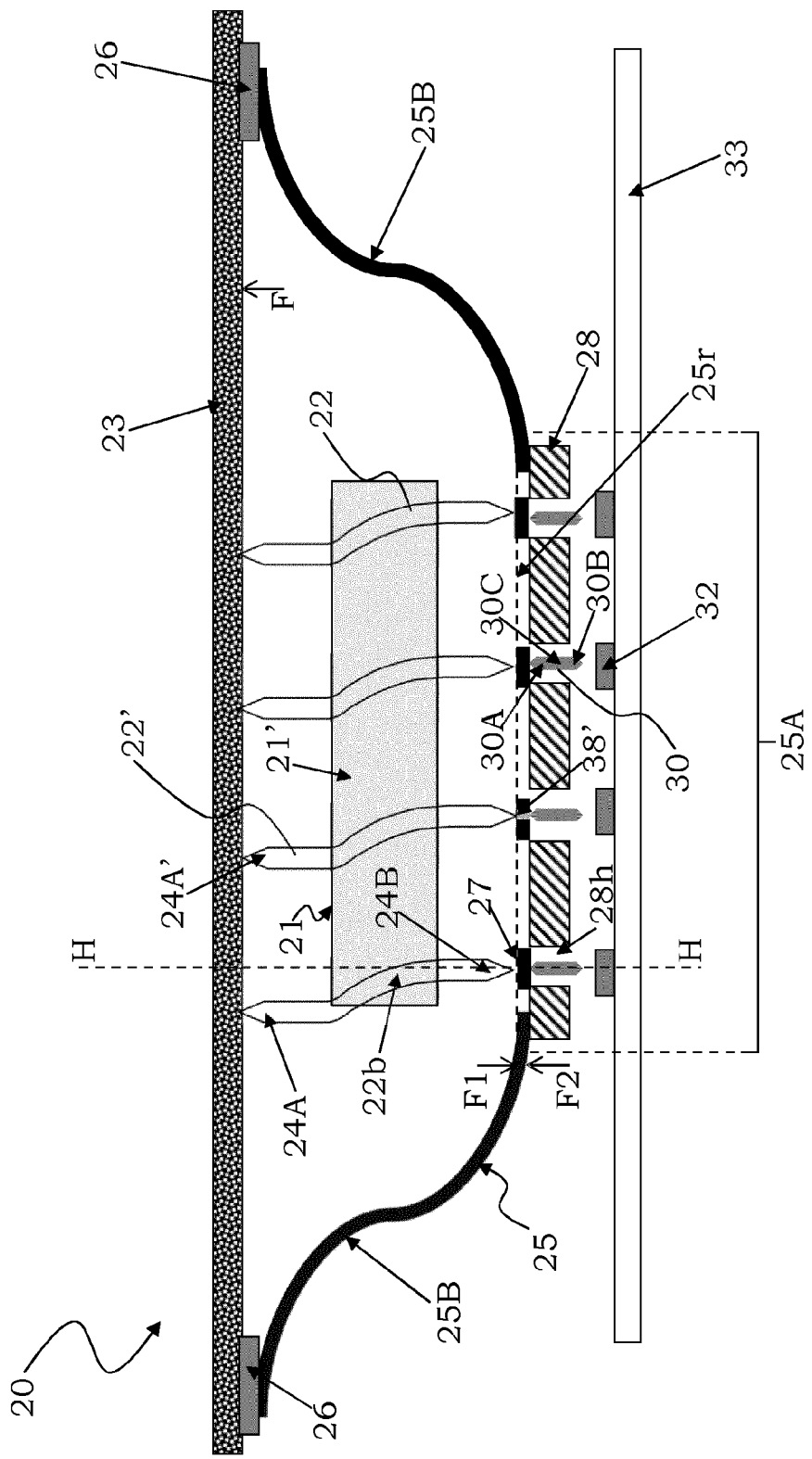
FIG. 7 schematically shows a probe card according to an alternative embodiment of the disclosure.

Alternatively, in an embodiment of the disclosure illustrated in FIG. 7, a group 22' of the contact elements 22 is also adapted to carry signals between the device under test and the testing apparatus. Each contact element of this group 22' is thus electrically connected to a corresponding micro contact probe 30 by means of connection conductive tracks 38' in the flexible membrane 25, said connection conductive tracks 38' extending between the first face F1 and the second face F2 of the flexible membrane 25. In other words, the connection conductive tracks 38' are adapted to connect the opposite faces F1 and F2 of the flexible membrane 25 to each other, these tracks being formed for instance by filling through-holes or through-paths made in the flexible membrane 25 with a conductive material.

The contact elements of the group 22' thus perform a dual function, namely on the one hand they act as damping elements of the probe card 20, in particular of the micro contact probes 30, and on the other hand they carry signals towards the support plate 23. In this embodiment, the contact elements not included in the group 22' are electrically insulated from the micro contact probes 30 (and also from the other contact elements) and only act as damping elements. The contact elements of the group 22' are adapted to carry power signals and/or ground signals and/or low-frequency signals between the device under test and said support plate 23.

In this embodiment, the support plate 23 comprises further conductive contact pads (not shown in the Figures) at the first end portion 24A' of the contact elements of the group 22', onto which these end portions abut for actually carrying the signals towards the testing apparatus.

The connection conductive tracks 38' can connect the lower contact pad 39 of the face F1 and the upper contact pad 40 of the face F2, or it is possible to make just one conductive pad that passes through the flexible membrane 25 and emerges on said faces F1 and F2.

In any case, the conductive tracks 38 extend from the central portion 25A of the flexible membrane 25 along the strips 27 up to the peripheral portion 25B, so as to connect to the support plate 23. In particular, the conductive tracks 38 are electrically connected, for instance by means of a pressing contact or a weld, to the contact pads 26 of the support plate 23.

Still referring to FIG. 6, the conductive tracks 38 extend along the second face F2 of the flexible membrane 25 from the respective micro contact probe 30, in particular from the respective lower contact pad 39.

The conductive tracks 38 can also extend on the first face F1 of the flexible membrane 25, if required by the configuration.

Furthermore, the conductive tracks 38 can also extend within the flexible membrane 25 (namely they can be embedded therein). In this case, the conductive tracks 38 in the flexible membrane 25 are made on different levels starting from the second face F2. The number of levels of the flexible membrane 25 where the conductive tracks 38 are made may vary according to the needs and/or circumstances, in particular according to the number of signals to be carried and thus according to the complexity of the routing pattern of the flexible membrane 25. By way of example, a configuration can be provided wherein a first level comprises tracks adapted to carry the power signal and a second level comprises tracks adapted to carry the ground signal.

The micro contact probes 30, which are adapted to contact the contact pads 32 of the device under test integrated on the semiconductor wafer 33, are made of a conductive material or of a suitable alloy.

The flexible membrane 25 is made of dielectric materials, preferably polyamide, capable of providing the desired flexibility and the desired electric insulation, whereas the conductive tracks 38 are made of a conductive metallic material, preferably copper.

The support plate 23 is similar the known PCBs, with the difference that its contact pads 26 are preferably made on a peripheral portion thereof, so that these contact pads 26 can electrically contact the conductive tracks 38 (or possible pads of the membrane) at the peripheral portion 25B of the flexible membrane 25.

Furthermore, the support 28 and the further support 29, if any, are preferably made of a ceramic material.

It should also be pointed out that the length of the strips 27, namely their dimension measured along the axis H'-H', may vary according to the needs and/or circumstances. By way of example, the length of the strips 27 can be very small, slightly greater than a maximum dimension of the lower contact pads 39, for instance in order to reduce the path of some ground signals. Preferably, the flexible membrane 25 comprises strips whose length is slightly greater than the lower contact pads 39, and also strips having greater extension.

Figure 8:
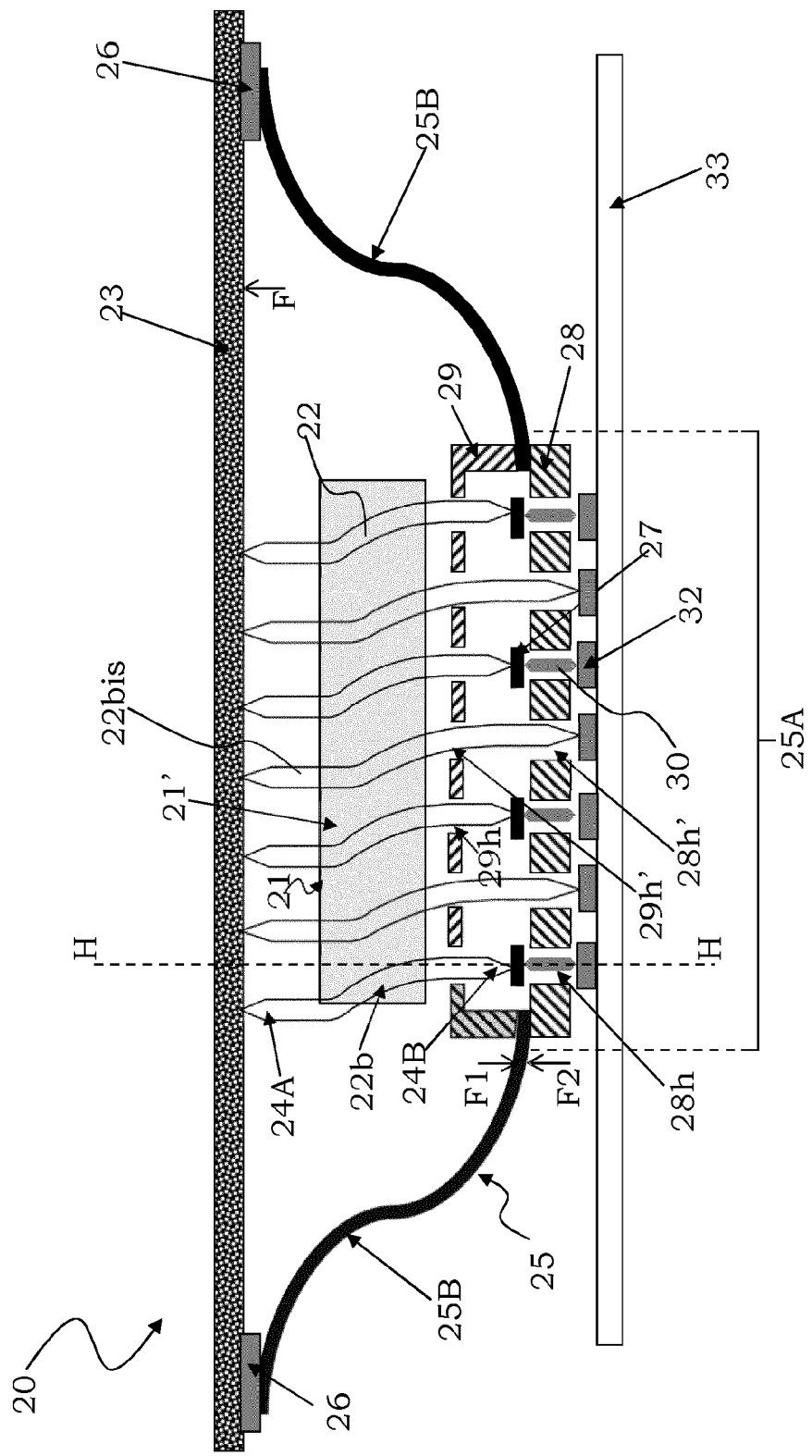
FIG. 8 schematically shows a probe card according to a further alternative embodiment of the disclosure.

In an alternative embodiment of the disclosure, shown in FIG. 8, the testing head 21 of the probe card 20 comprises further contact elements 22bis adapted to carry power signals and/or ground signals and/or low-frequency signals between the device under test and the support plate 23, i.e. signals that can be carried also by longer probes.

In particular, the support 28 comprises in this case further guide holes 28h' for the passage of the further contact elements 22bis. When also the further support 29 is present, as illustrated in FIG. 8, the latter comprises a plurality of second guide holes 29h', which are concentric to the further guide holes 28h', for the passage of the further contact elements 22bis.

Figure 9:
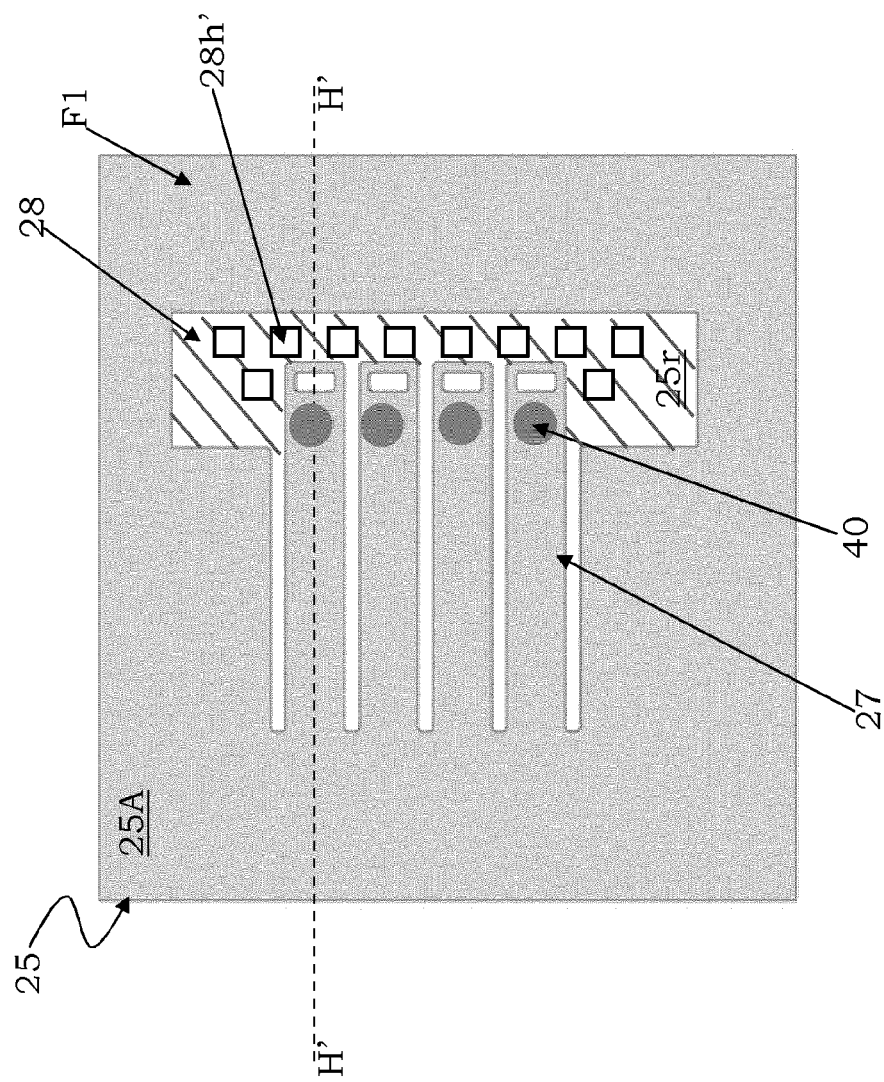
FIG. 9 shows a schematic top view of a portion of the probe card of FIG. 8, showing in particular a portion of the flexible membrane arranged on the support.

As illustrated in FIG. 9, the further guide holes 28h' are formed in the support 28 in an area thereof that substantially corresponds to the opening 25r of the flexible membrane 25, so as not to further pierce the flexible membrane 25.

In a further embodiment not illustrated, the flexible membrane 25 can be further shaped or cutout so as to allow the passage of the further contact elements 22bis in any portion.

Obviously, the contact elements 22 and the further contact elements 22bis are designed so that these further contact elements 22bis and the micro contact probes 30 exert substantially identical forces onto the contact pads 32 of the device under test during the overtravel, as well as comparable scrubs.

Figure 10A:
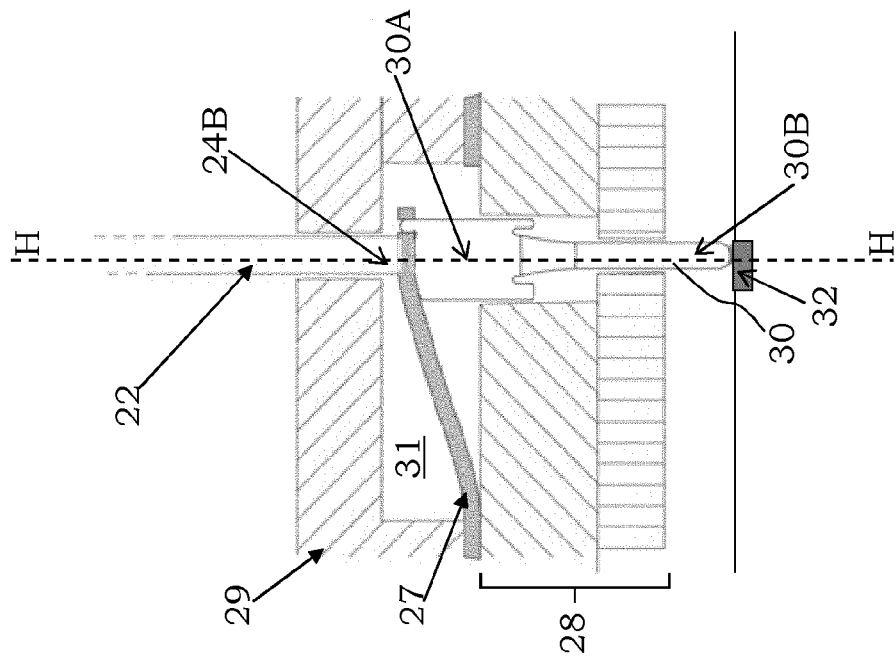
FIGS. 10A and 10B schematically show the operation of the probe card according to the disclosure, under different operating conditions.
Figure 10B:
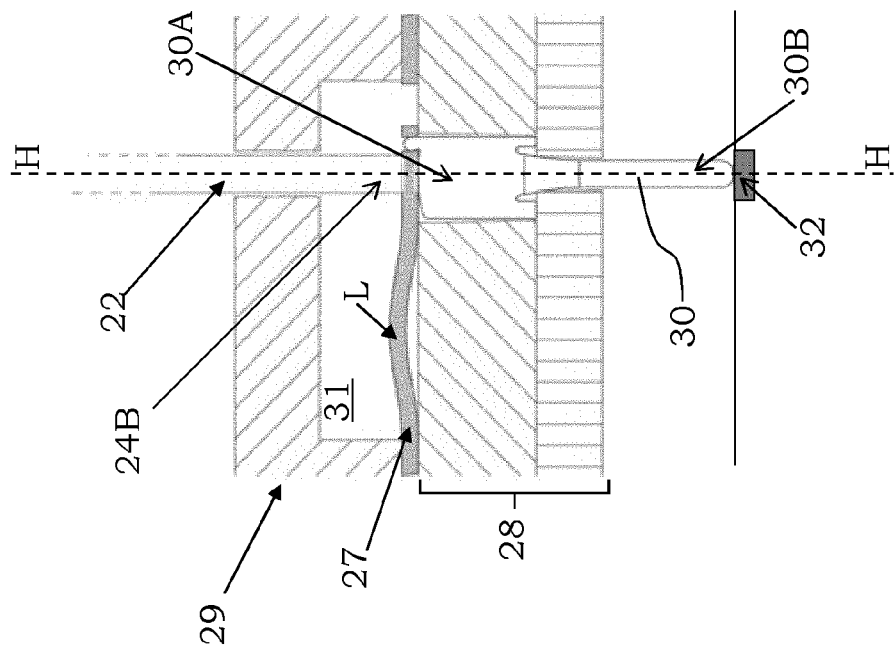

Referring now to FIGS. 10A and 10B, the operation of the probe card 20 according to the disclosure is shown, under different operating conditions. In particular, starting from a rest position (FIG. 10A) where the strips 27 of the flexible membrane 25 lie on the support 28, when the second end portion 30B of the micro contact probes 30 contact the device under test (FIG. 10B), the strips 27 of the flexible membrane 25 are lifted and move along the longitudinal axis H-H, while the contact elements 22 always ensure the correct pressure of the micro contact probes 30 onto the contact pads 32 of the device under test, as well as the correct pressure of the flexible membrane 25 onto the first end portion 30A of said micro contact probes 30. Furthermore, it should also be noted that the lifted portion L of the strips 27 is such as to avoid unfavorable traction stresses.

In this regard, it is pointed out that the pressure exerted by the contact elements 22 onto the micro contact probes 30 is suitably calibrated so that, on the one hand the flexible membrane 25 is always pushed against the first end portion 30A of the micro contact probes 30, and that on the other hand a correct mechanical and electric contact of the micro contact probes 30 with the device under test is always ensured, i.e. it is calibrated taking into account both the pre-loading pressure and the working pressure.

Finally, it is observed that, in an embodiment of the disclosure not shown in the Figures, the main body 21' of the testing head 21 comprises at least one guide provided with a plurality of guide holes within which the contact elements 22 are slidingly housed.

In conclusion, the disclosure provides a probe card provided with micro contact probes adapted to contact a device to be tested, each of those micro contact probes having an end portion abutting onto an end of a respective strip of a plurality of strips formed in a flexible membrane of the probe card, wherein contact elements of a testing head of the probe card also have an end portion abutting onto such end of the strips but onto an opposite face of the flexile membrane, in this way acting as damping support elements for the corresponding micro contact probes, the end portion of those strips moving during the contact of the micro contact probes with the device to be tested.

Advantageously according to the disclosure, the probe card is particularly performing in radiofrequency applications, thanks to the reduced dimensions of the micro contact probes comprised therein, having a length much lower than that of the contact elements and in particular lower than 500 µm.

The presence of the contact elements of the testing head interposed between the flexible membrane and the PCB, which act as damping elements for each micro contact probe (namely they are adapted to damp the contact between the micro contact probe and the contact pads of a device under test), allows overcoming the problem of the rigidity of said micro contact probes having a reduced length, drastically reducing the possibility of breakage of the microprobes themselves, at the same time ensuring a proper reduction in the pressure they exert, avoiding any breakages of the contact pads of the devices under test onto which the micro contact probes abut.

The contact elements of the testing head, thanks to their length greater than the one of the respective micro contact probes, have a much greater bending capacity.

As a result, the probe card of the disclosure on the one hand allows testing high-frequency electronic devices, and on the other hand allows avoiding the breakage of its micro contact probes and/or of the contact pads of the device under test, thus solving the technical problem of the disclosure.

Suitably, the micro contact probes of the probe card of the disclosure have a very long working life, said micro contact probes being in any case easily replaceable.

The presence of a plurality of discrete contact elements abutting onto the distal end of the strips of the flexible membrane makes the disclosure particularly attractive compared to the known solutions, each of those contact elements providing a support for a corresponding micro contact probe independently of the other contact elements and of the other micro contact probes, therefore compensating for any possible lack of uniformity in the probe card, in terms of levels, heights and force exerted onto the pads.

In this way, there is a complete independence of the movement of a micro contact probe with respect to the adjacent ones, thanks to the independence of movement of the single contact elements that act as damping elements for said microprobes and to the presence of the different flexible strips of the membrane itself.

Therefore, the probe card of the disclosure works correctly even in case of planarity problems of its components or of the wafer and of the devices under test comprised therein.

Furthermore, the contact elements also act as pre-loading elements for the micro contact probes, ensuring the micro contact probes to always be associated with the respective flexible strip of the membrane, which also performs the desired routing of the signals within the probe card.

It is also observed that, advantageously according to the disclosure, the flexible membrane, the micro contact probes and the contact elements are structurally independent from each other, thereby ensuring a prober operation of the probe card. For example, the contact elements are not fixedly fastened (i.e. soldered) to the flexible membrane and simply abut onto this flexible membrane, thus avoiding possible undesirable stresses.

Furthermore, the hybrid configuration, in which further contact elements are adapted to carry specific signals, greatly simplifies the signal routing by the flexible membrane, especially in the case of several signals to be carried by the probe card. For instance, by means of the further contact elements it is possible to carry power signals and/or ground signals, namely signals that do not require short contact probes, whereas the high-frequency signals, which require short probes to avoid self-inductance problems, are carried by the micro contact probes associated with the flexible membrane.

Finally, it should be pointed out that the several advantages of the probe card of the disclosure are achieved by exploiting the technology of the vertical probe testing heads, without excessively complicating its manufacturing process.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

That which is claimed is:

1. A probe card comprising:
 a plurality of contact elements extending along a longitudinal axis between a first end portion and a second end portion;
 a testing head housing the plurality of contact elements;
 a support plate;
 a flexible membrane having a first face and a second and opposite face;
 at least one support;
 a plurality of micro contact probes comprising a body extending along said longitudinal axis between a first end portion and a second end portion;

the first end portion of the plurality of contact elements being adapted to abut onto the support plate;

the flexible membrane having a first portion arranged on the support and comprising a plurality of strips extending between a proximal end and a distal end and a second portion;

the second end portion of the plurality of contact elements abuts onto the first face of the flexible membrane at the distal end of a respective strip;

the first end portion of each micro contact probe abuts onto the second face of the flexible membrane at a respective contact element;

the flexible membrane being electrically connected to the support plate through the second portion;

the second end portion of the micro contact probes being configured to contact pads of a device to be tested;

the at least one support being provided with a plurality of guide holes for housing the plurality of micro contact probes; and the strips being movable from a first configuration in which they lie on the support, to a second configuration in which the distal ends thereof are lifted by the micro contact probes during the contact with the device to be tested.

2. The probe card of claim 1, further comprising a retainer adapted to keep in place the flexible membrane.

3. The probe card of claim 2, wherein the retainer comprises:
a further support provided with a plurality of further guide holes for housing the contact elements;
a gap defined between the support and the further support;
the flexible membrane being arranged between the support and the further support; and
the gap allowing a movement of the distal end of the strips during the contact of the second end portion of the micro contact probes with the contact pads of the device to be tested.

4. The probe card of claim 3, wherein the gap between the support and the further support is formed by a recess made in the further support.

5. The probe card of claim 3, wherein the further support is divided into a first plate-like element, which comprises a central opening, and a second plate-like element, which is on the top of the first plate-like element and the gap is defined by the central opening of the first plate-like element.

6. The probe card of claim 1, wherein the guide holes of the support comprise a recessed portion that forms a shoulder in the support.

7. The probe card of claim 6, wherein the support comprises at least one first and at least one second plate-like element, which are overlapped and integral with each other, the first plate-like element being provided with openings having a larger diameter with respect to corresponding openings of the second plate-like element, the openings of the first plate-like element being concentrically overlapped with the openings of the second plate-like element, the overlapped openings forming the guide holes of the support provided with the recessed portion.

8. The probe card of claim 1, wherein:
the distal end of each of the strips of the flexible membrane comprises an opening;
the first end portion of the micro contact probes comprises an engagement portion;
the engagement portion engaging with the opening and comprises a first member and a second member separated by a space;

the first and second members being adapted to be inserted into the opening and to be moved one towards the other by the walls of the opening.

9. The probe card of claim 1, wherein the micro contact probes have a length lower than a length of the contact elements, the length being measured along the longitudinal axis.

10. The probe card of claim 1, wherein the flexible membrane includes conductive tracks extending from the distal end of the strips.

11. The probe card of claim 10, wherein the second face of the distal end of each of the strips comprises a lower contact element onto which the first end portion of the micro contact probes abuts, the conductive tracks extending from the lower contact element.

12. The probe card of claim 10, wherein the conductive tracks of the flexible membrane are electrically connected to contact pads of the support plate.

13. The probe card of claim 1, wherein the first face of the distal end of each of the strips comprises an upper contact element onto which the second end portion of the contact elements abuts.

14. The probe card of claim 1, comprising further contact elements which are configured to carry between the device to be tested and the support plate signals chosen between power signals, ground signals and low frequency signals.

15. The probe card of claim 1, wherein the first end portion of the micro contact probes includes a beveled portion at an upper edge thereof.

16. The probe card of claim 1, wherein the first end portion of the micro contact probes has a diameter greater than a diameter of the body, diameter meaning a maximum transverse dimension.

17. The probe card of claim 16, wherein the diameter of the body is variable along the longitudinal axis, the body being rod-shaped and comprising an enlarged portion within which the diameter has a maximum value at the first end portion, the diameter decreasing within the enlarged portion along the longitudinal axis away from the first end portion and being constant outside the enlarged portion.

18. The probe card of claim 16, wherein the first portion of the flexible membrane is a central portion and the second portion of the flexible membrane is a peripheral portion.

19. The probe card of claim 16, wherein each strip comprises a lifted portion.

20. The probe card of claim 16, further comprising strips having a different length, the length being measured along an axis of the strips.

21. A probe card comprising:
a plurality of contact elements extending along a longitudinal axis between a first end portion and a second end portion and being housed in a testing head;
a plurality of micro contact probes comprising a body extending along said longitudinal axis between a first end portion and a second end portion;
a flexible membrane having a first face and a second and opposite face as well as a first portion and a second portion, the first portion being arranged on the support and comprising a plurality of strips extending between a proximal end and a distal end;
a support plate;
at least one support;
a retainer adapted to keep in place the flexible membrane;
the first end portion of the plurality of contact elements being configured to abut onto the support plate and the second end portion of the plurality of contact elements being adapted to abut onto the first face of the flexible membrane at the distal end of a respective strip;

the first end portion of each micro contact probe being configured to abut onto the second face of the flexible membrane at a respective contact element and the second end portion of the micro contact probes being configured to contact pads of a device to be tested;

the flexible membrane being electrically connected to the support plate through the second portion;

the strips being movable from a first configuration in which they lie on the support, to a second configuration in which the distal ends thereof are lifted by the micro contact probes during the contact with the device to be tested, and the retainer comprising a further support provided with a plurality of further guide holes for housing the contact elements, and a gap defined between the at least one support and the further support;

the flexible membrane being arranged between the at least one support and the further support; and the gap allowing a movement of the distal end of the strips during the contact of the second end portion of the micro contact probes with the contact pads of the device to be tested.

22. The probe card of claim 21, wherein the gap between the support and the further support is formed by a recess in the further support.

23. The probe card of claim 21, wherein the further support is divided into a first plate-like element, which comprises a central opening, and a second plate-like element, which is on the top of the first plate-like element and the gap is defined by the central opening of the first plate-like element.

24. The probe card of claim 21, wherein the flexible membrane includes conductive tracks extending from the distal end of the strips electrically connected to contact pads of the support plate.

25. The probe card of claim 21, further comprising strips having a different length, the length being measured along an axis of the strips.

* * * * *